United States Patent
Lu et al.

(10) Patent No.: US 9,633,958 B2
(45) Date of Patent: Apr. 25, 2017

(54) BONDING PAD SURFACE DAMAGE REDUCTION IN A FORMATION OF DIGITAL PATTERN GENERATOR

(71) Applicant: Taiwan Semiconductor Manufacturing Company, Ltd., Hsin-Chu (TW)

(72) Inventors: Chih Wei Lu, Hsin-Chu (TW); Tsung-Chih Chien, Hsin-Chu (TW); Hui-Min Huang, Hsin-Chu (TW); Tien-I Bao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/610,686

(22) Filed: Jan. 30, 2015

(65) Prior Publication Data

US 2016/0225612 A1    Aug. 4, 2016

(51) Int. Cl.
*H01L 21/027* (2006.01)
*H01L 21/311* (2006.01)
*H01L 23/31* (2006.01)
*H01L 23/00* (2006.01)

(52) U.S. Cl.
CPC .............. *H01L 24/05* (2013.01); *H01L 24/03* (2013.01); *H01J 2237/31789* (2013.01); *H01L 2224/0391* (2013.01)

(58) Field of Classification Search
CPC ........... H01L 21/31144; H01L 23/3171; H01L 23/3192; H01L 24/03; H01L 24/05; H01L 21/0277; H01L 2224/0391

USPC .......................................... 257/782; 438/703
See application file for complete search history.

(56) References Cited

U.S. PATENT DOCUMENTS

| | | | |
|---|---|---|---|
| 6,162,652 A * | 12/2000 | Dass .................. | G01R 31/2884 257/E21.508 |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |

(Continued)

OTHER PUBLICATIONS

Grella et al, J. Micro/Nanolith. MEMS MOEMS 12(3), 031107 (Jul.-Sep. 2013).*

*Primary Examiner* — Cuong Q Nguyen
*Assistant Examiner* — Tong-Ho Kim
(74) *Attorney, Agent, or Firm* — Haynes and Boone, LLP

(57) ABSTRACT

A method of fabricating a Digital pattern generator (DPG) device is disclosed. The method includes forming an etch-stop-layer (ESL) over a bonding pad in a first region over a substrate, forming a pixel well in the second region over the substrate, forming an anti-charging layer over the bonding pad and along sidewalls of the pixel well. The bonding pad is covered by the ESL during the forming of the anti-charging layer over the bonding pad. The method also includes removing the anti-charging layer over the bonding pad. Therefore, after removing the anti-charging layer over the bonding pad, the bonding pad remains covered by the ESL.

20 Claims, 12 Drawing Sheets

(56) References Cited

U.S. PATENT DOCUMENTS

| | | |
|---|---|---|
| 8,278,152 B2 | 10/2012 | Liu et al. |
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 2006/0022343 A1* | 2/2006 | Lin .................. H01L 21/76829 257/758 |
| 2014/0001645 A1 | 1/2014 | Lin et al. |
| 2014/0225258 A1 | 8/2014 | Chiu et al. |
| 2014/0252572 A1 | 9/2014 | Hou et al. |

* cited by examiner

BONDING PAD SURFACE DAMAGE REDUCTION IN A FORMATION OF DIGITAL PATTERN GENERATOR

BACKGROUND

Semiconductor integrated circuit (IC) fabrication involves forming multiple material layers with designed patterns on a semiconductor wafer. Those patterned material layers on the semiconductor wafer are aligned and configured to form one or more functional circuits. Photolithography systems are used to pattern a semiconductor wafer. When semiconductor technology continues progressing to circuit layouts having smaller feature sizes, a lithography system with higher resolution is need to image an IC pattern with smaller feature sizes. An electron-beam (e-beam) system is introduced for lithography patterning processes as the electron beam has wavelengths that can be tuned to very short, resulting in very high resolution. Digital pattern generator (DPG) is an important component of reflective e-beam lithography system. Usually a DPG is bonded to a support substrate through bonding pads. Sometimes bonding pads experience damages during a formation of the DPG, which may cause future bonding process failure. Improvements in this area are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

Figure 1A:
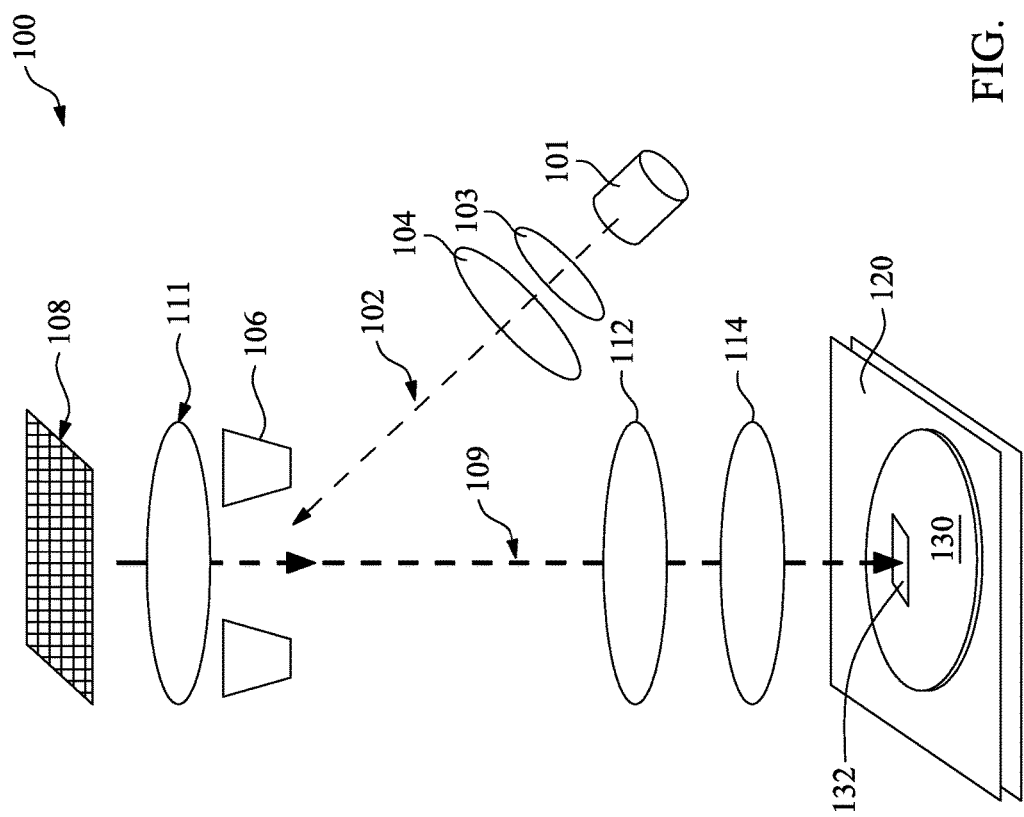
FIG. 1A is a diagrammatic view of one embodiment of an electron-beam (e-beam) lithography system for integrated circuit (IC) patterning constructed according to aspects of the present disclosure.

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1A illustrates a schematic view of an e-beam lithography system 100 constructed in accordance with some embodiments of the present disclosure. The e-beam lithography system 100 is an electron-based lithography technique that utilizes an electron-based imaging for various integrated circuits (IC) patterning. The e-beam lithography system 100 transfers an IC design pattern to an e-beam sensitive resist (e-beam-resist or resist) layer coated on a substrate, such as a semiconductor wafer. The e-beam lithography system 100 provides a higher imaging resolution than that of an optical lithography because an electron beam can be energized to have a shorter wavelength.

The e-beam lithography system 100 includes an electron source 101 to provide an electron beam 102. In furtherance of the embodiment, the electron source 102 is an electron gun with a mechanism to generate electrons, such as by thermal electron emission. In a particular example, the electron gun includes a tungsten (or other suitable material) filament designed and biased to thermally emit electrons. In some embodiments, the e-beam 102 from the e-beam source 101 is a continuous e-beam with constant beam intensity over time.

The e-beam lithography system 100 may further include e-beam lens (gun lens) 103 configured in the front of the e-beam source 101 to control the e-beam 102. The e-beam lens 103 controls the e-beam 102 to have a proper direction and/or a beam size. In one embodiment, the e-beam lens 103 may tune the e-beam 102 from the e-beam source 101 to have a large spot with a uniform space distribution. In another embodiment, the e-beam 102 may be further processed to have a proper beam spot and uniformity by other electron lenses.

The electron-beam lithography system 100 further includes an alignment gate 104 designed to modulate the e-beam 102 in terms of intensity, such as a beam intensity periodically changing over time. The alignment gate 104 includes a proper mechanism to modulate the e-beam 102 to form the alternating e-beam. In one embodiment, the alignment gate 104 includes a mechanism to modulate the e-beam 102 through an electrical field. In another embodiment, the alignment gate 104 includes a mechanism to modulate the e-beam 102 through a material layer with a dynamically controllable transmission to the e-beam 102. In other embodiment, the alignment gate 104 includes any suitable mechanism to effectively and dynamically control the intensity of the e-beam 102 over time. The e-beam lithography system 100 further includes other components synchronize the alignment gate 104 with a digital pattern generator (DPG), which will be described later.

The e-beam lithography system 100 may include a Wien filter 106 as an e-beam filter. The Wien filter 106 includes a module to generate perpendicular electric and magnetic fields that are used as a velocity filter.

Figure 1B:
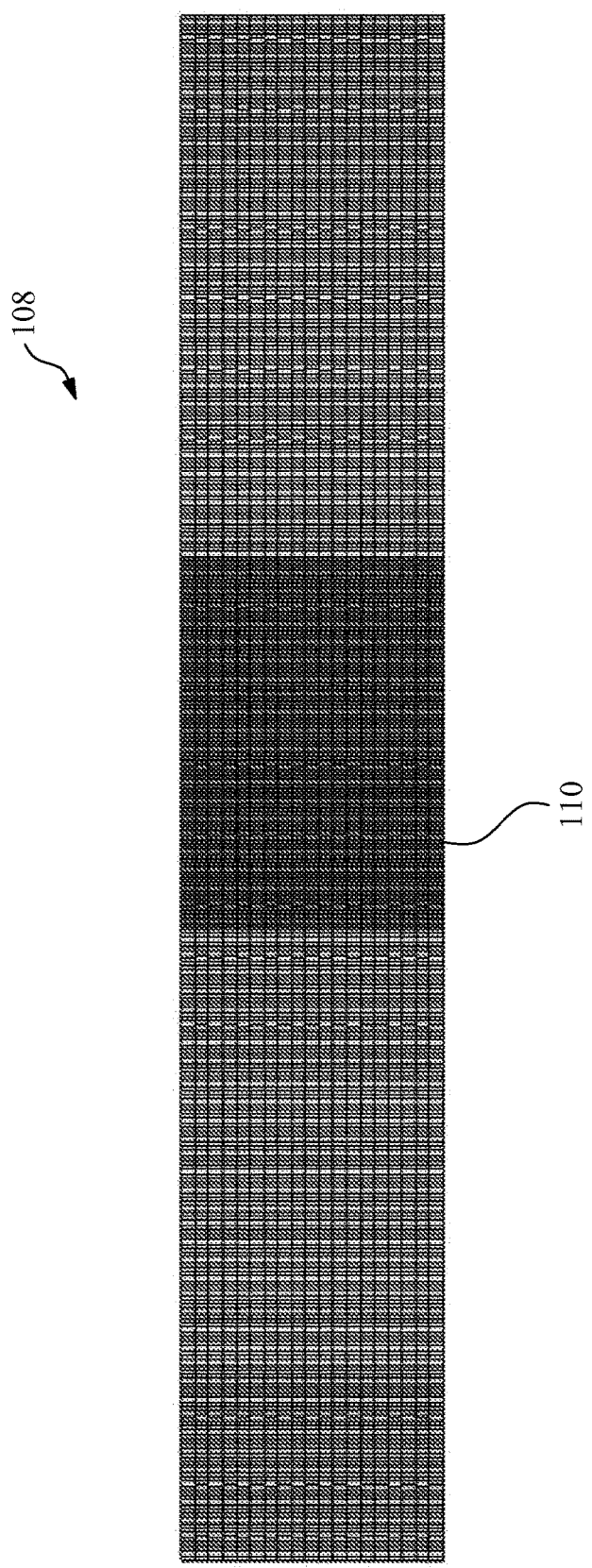
FIG. 1B is a schematic view of a DPG with a plurality of pixels constructed in accordance with some embodiments.

The electron-beam lithography system 100 also includes a DPG 108 to generate a patterned e-beam array 109. The DPG 108 is a structure that includes a plurality of pixels 110 configured in an array, as illustrated in FIG. 1B constructed according to one embodiment. In this embodiment, the plurality of pixels 110 is configured in an array that has a rectangular shape. The DPG 108 also includes a mechanism to enable individual pixel to toggle between on and off states. When a pixel is on, the pixel reflects the e-beam 102 (or a portion of the e-beam 102) projected on that pixel. When a pixel is off, the pixel does not reflect the e-beam 102 (or a portion of the e-beam 102) projected on that pixel. In one embodiment, the DPG 108 includes an integrated circuit (IC) based chip having an array of pixels controllable by a built-in drive circuit. In furtherance of the embodiment, the DPG 108 may include an IC chip with technologies such as complimentary metal-oxide-semiconductor filed effect transistor (CMOSFET), or fin-type filed effect transistor (FinFET).

The e-beam lithography system 100 may also include a DPG lens 111 properly configured with the Wien filter 106. The system 100 further includes other lens features, such as an upper demagnification lens 112 and a lower demagnification lens 114 properly configured for proper imaging effects.

The e-beam lithography system 100 also includes a wafer stage 120 to secure a wafer 130. In the present embodiment, the wafer 130 is coated with a resist layer to be patterned in a lithography process by the e-beam lithography system 100. The resist layer includes a resist material sensitive to electrons (so also referred to as e-beam resist). The resist material includes a component that resist to an IC fabrication process, such as etch and/or ion implantation. The resist material further includes a component sensitive to electrons. The resist material may be negative tone or positive tone. In one example, the resist material includes polymethyl methacrylate (PMMA).

In one embodiment, the wafer stage 120 is operable to move transitionally or rotationally such that the patterned e-beam array 109 is directed to various locations of the resist layer on the wafer 130. In one example, the wafer stage 120 and the DPG 108 are designed to coordinately move the patterned e-beam array 109 relative to the wafer 130. Particularly, in one embodiment, the wafer 130 includes a plurality of regions (fields) 132 to be patterned.

The e-beam lithography system 100 may also include other components, such as a clock circuit to drive the DPG 108. Furthermore, the clock circuit and the DPG 108 may be connected to a same frequency source such that the alternating e-beam 102 from the alignment gate 104 and the clock signal from the clock circuit are both periodic over time with a same frequency.

Figure 2:
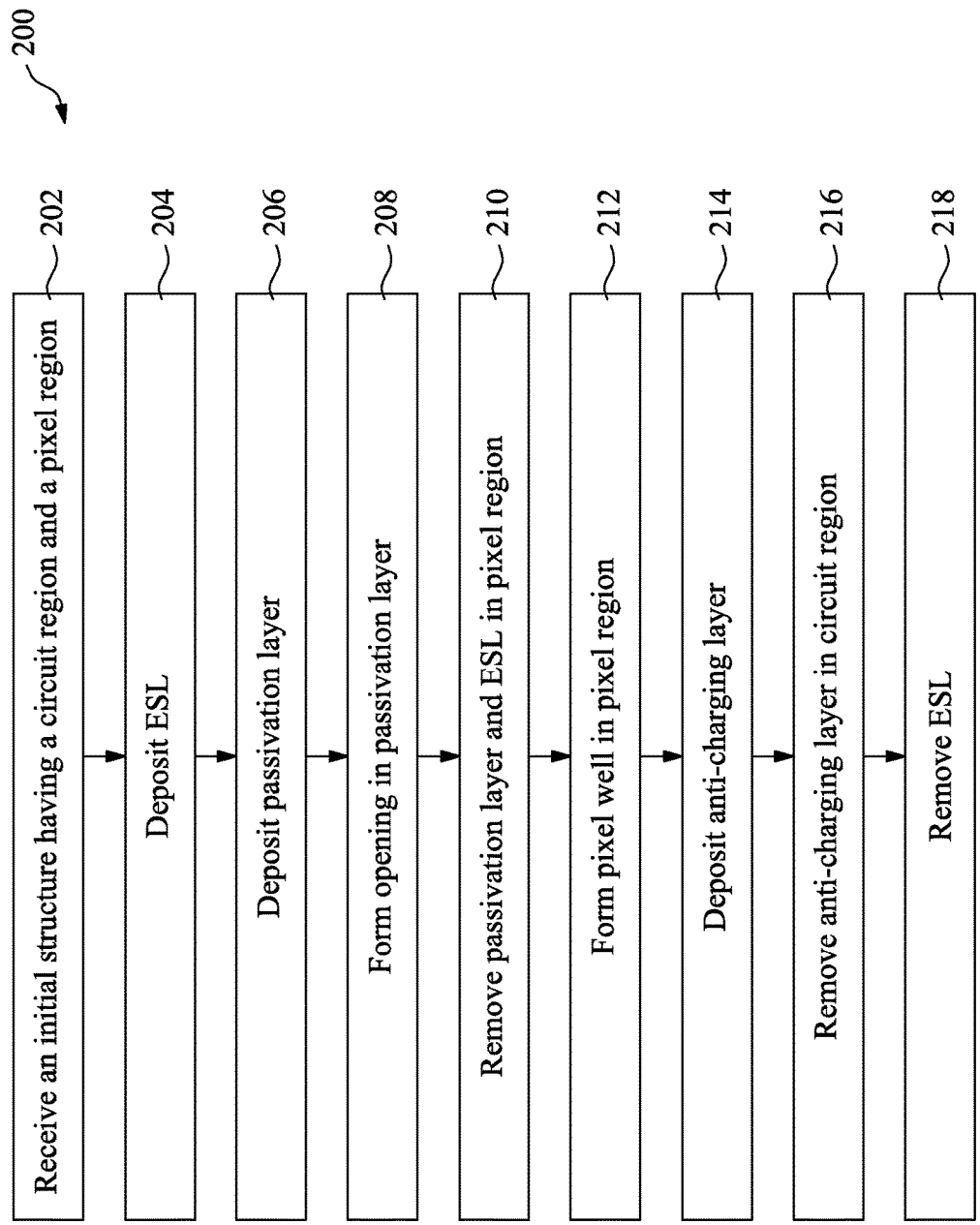
FIG. 2 is a flowchart of a method of an example for fabricating a digital pattern generator (DPG) device in accordance with some embodiments.
Figure 3:
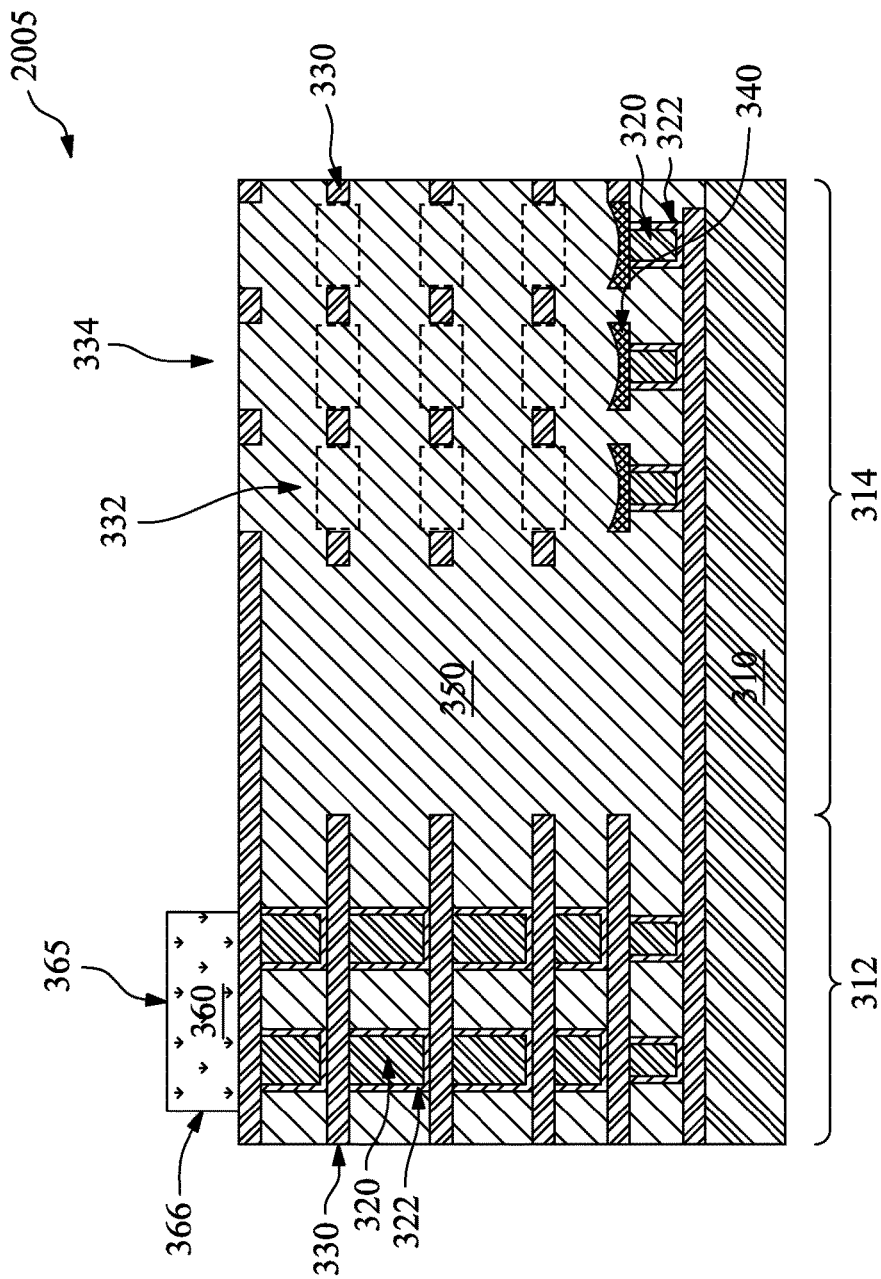
FIGS. 3 to 10 are sectional views of a DPG device, in portion, constructed in accordance with some embodiments.

The following description directs to, but not limited to, a structure and fabrication process of a DPG device. During the DPG device formation, an anti-charging layer is usually deposited over a formed bonding pad and it is needed to be removed from the bonding pad later. The etch process of removing the anti-charging layer usually experiences an inadequate selectivity with respect to the bonding pad and results in surface damages in the bonding pad, which may cause a future bonding process failure. The present disclosure provides a method to reduce/eliminate bonding pad surface damage during forming a DPG device. FIG. 2 is a flowchart of an embodiment of a method 200 for making a DPG device 2000 constructed according to various aspects of the present disclosure in one or more embodiments. FIG. 3 is a cross-section view of an initial structure 2005 of the DPG device 2000 at a fabrication stage constructed according to one or more embodiments. FIGS. 4 to 10 are sectional views of the DPG device 2000 at various fabrication stages and constructed according to one or more embodiments. The DPG device 2000 and the method 200 of making the same are collectively described with reference to FIGS. 3 through 10.

Referring to FIGS. 2 and 3, the method 200 starts at step 202 by receiving an initial structure 2005 of the DPG device 2000. The initial structure 2005 includes a substrate 310 having a circuit region 312 and a pixel region 314. In some embodiments, the substrate 310 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 310 may also comprise non-semiconductor materials including soda-lime glass, fused silica, fused quartz, calcium fluoride (CaF2), and/or other suitable materials. In some embodiments, the substrate 310 has one or more layers defined within it, such as an epitaxial layer. For example, in one such embodiment, the substrate 310 includes an epitaxial layer overlying a bulk semiconductor. Other layered substrates include semiconductor-on-insulator (SOI) substrates. In one such SOI substrate, the substrate 310 includes a buried oxide (BOX) layer formed by a process such as separation by implanted oxygen (SIMOX).

The initial structure 2005 may also include various active and passive microelectronic components (not shown) in the circuit region 312. These components may include peripheral circuit elements to interface with or control the DPG device 2000. The peripheral circuit may include one or more field effect transistor. Other examples include P-channel field effect transistors (PFETs), N-channel FETs (NFETs), metal-oxide semiconductor field effect transistors (MOSFETs), CMOS transistors, Fin-like FETs, high voltage transistors, high frequency transistors, bipolar junction transistors, resistors, capacitors, diodes, fuses, other suitable devices, and/or combinations thereof.

The initial structure 2005 may include a plurality of interconnection features 320 to connect various components in the substrate 310, resulting in a functional designed circuit. For example, the interconnection features 320 include multi-layer interconnect (MLI) having horizontal metal lines formed on multiple metal layers and contact/via features to vertically connect metal lines of different metal layers or metal line lines to the substrate 310. The interconnection feature 320 can be made by conductive materials such as copper, aluminum, aluminum/silicon/copper alloy, titanium, titanium nitride, tungsten, polysilicon, metal silicide, and/or combinations thereof. In some embodiments, the interconnection feature 320 is formed with a barrier layer 322 to prevent diffusion and/or provide material adhesion. The barrier layer 322 may include titanium nitride (TiN), tantalum nitride (TaN), tungsten nitride (WN), titanium silicon nitride (TiSiN) or tantalum silicon nitride (TaSiN).

The initial structure 2005 also includes a stack of conductive layers 330, which is separated by an insulating layer 350 and connected by the interconnection features 320. The conductive layer 330 may include TiN, TaN, WN, TiSiN TaSiN, and/or any suitable material. In some embodiment, different voltages may apply to the different conductive layers 330 to establish different functions, such as focusing, extracting, screening and deflecting an incoming electron beam. In the pixel region 314, the conductive layers 330 have a plurality of apertures 332 and each aperture 332 is vertically aligned with the respective apertures 332 in other conductive layers 330. For the sake of clarity to better description of concepts of the present disclosure, it is named these vertically aligned apertures 332 as an aperture stack 334.

The initial structure 2005 also includes a plurality of base electrode 340, aligned to the respective aperture stack 334, at bottoms of the aperture stacks 334. The base electrode 340 is individually controlled by receiving voltage through a conductive feature 320 to achieve the "off" and "on" states.

In some embodiments, the base electrode 340 is formed to have a curved (cupped) surface to achieve a low turn off voltage.

The initial structure 2005 also include an insulating layer 350 in both of the circuit region 312 and the pixel region 314 to provide electric insulation for conductive features or layers, such as the interconnection features 320 and the conductive layer 330. In one embodiment, the base electrode 340 is embedded in the isolating layer 350. The insulating layer 350 includes any suitable insulating material, such as silicon oxide, silicon nitride, or silicon oxynitride.

The initial structure 2005 also includes a bonding pad 360 over the top-most conductive layer 330 in the circuit region 312. Through the bonding pad 360, the DPG device 2000 may be bonded to another device, such as a microelectromechanical system (MEMS) device having a variety of structures or elements operable for mechanical movement. The bonding pad 360 may be made of aluminum (Al), copper (Cu), or their combination (AlCu), or other suitable conductive material. The bonding pad 360 has a top surface 365 and sidewalls 366. In the present embodiment, the top surface 365 is quite uniform, which is important to a success of future bonding process.

Figure 4:
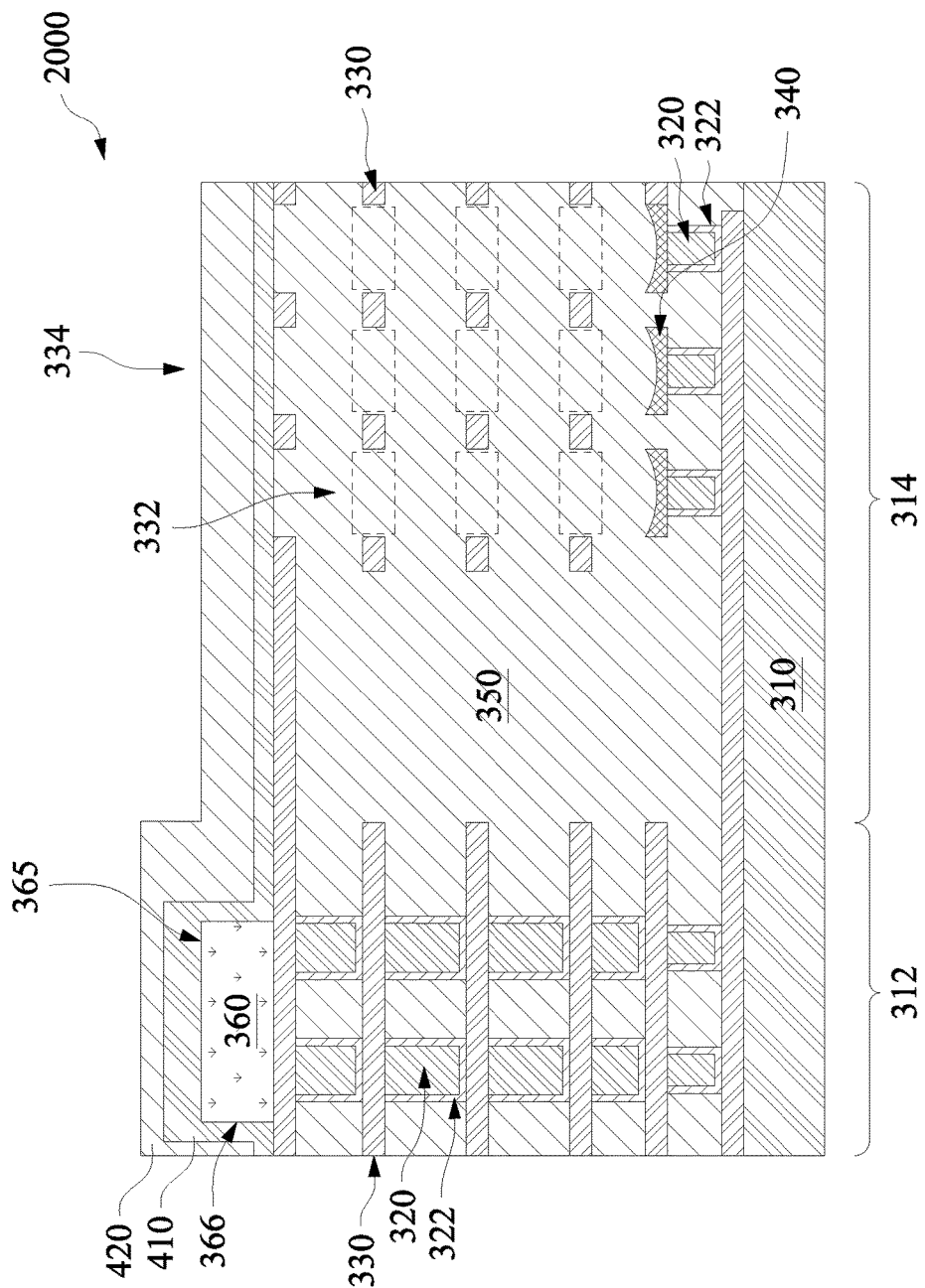

Referring to FIGS. 2 and 4, once the initial structure 2005 is received, the method 200 proceeds to step 204 by depositing an etch-stop-layer (ESL) 410 over the substrate 310. In the present embodiment, the ESL 410 wraps over the bonding pad 360, including covering the top surface 365 and along sidewalls 366. The ESL 410 may include silicon nitride, oxynitride, silicon carbide, titanium oxide, titanium nitride, tantalum oxide, tantalum nitride, and/or any suitable materials. In the present embodiment, the ESL 410 includes a material which is different from the bonding pad 360 to achieve etching selectivity in subsequent etches. In one embodiment, the ESL 410 includes silicon nitride. The ESL 410 may be deposited by a suitable technique, such as chemical vapor deposition (CVD), physical vapor deposition (PVD) and atomic layer deposition (ALD).

Referring again to FIGS. 2 and 4, the method 200 proceeds to step 206 by depositing a passivation layer 420 over the ESL 410. The passivation layer 420 may include silicon oxide, silicon nitride, oxynitride, silicon carbide, and/or any suitable materials. In the present embodiment, the passivation layer 420 includes a material which is different from the ESL 410 to achieve etching selectivity in subsequent etches. The passivation layer 420 may include multiple layers. For example, the passivation layer 420 includes a silicon oxide layer deposited over the ESL 410 and a silicon nitride layer deposited over the silicon oxide layer. The passivation layer 420 may be deposited by a suitable technique, such as CVD, PVD and ALD.

Figure 5:
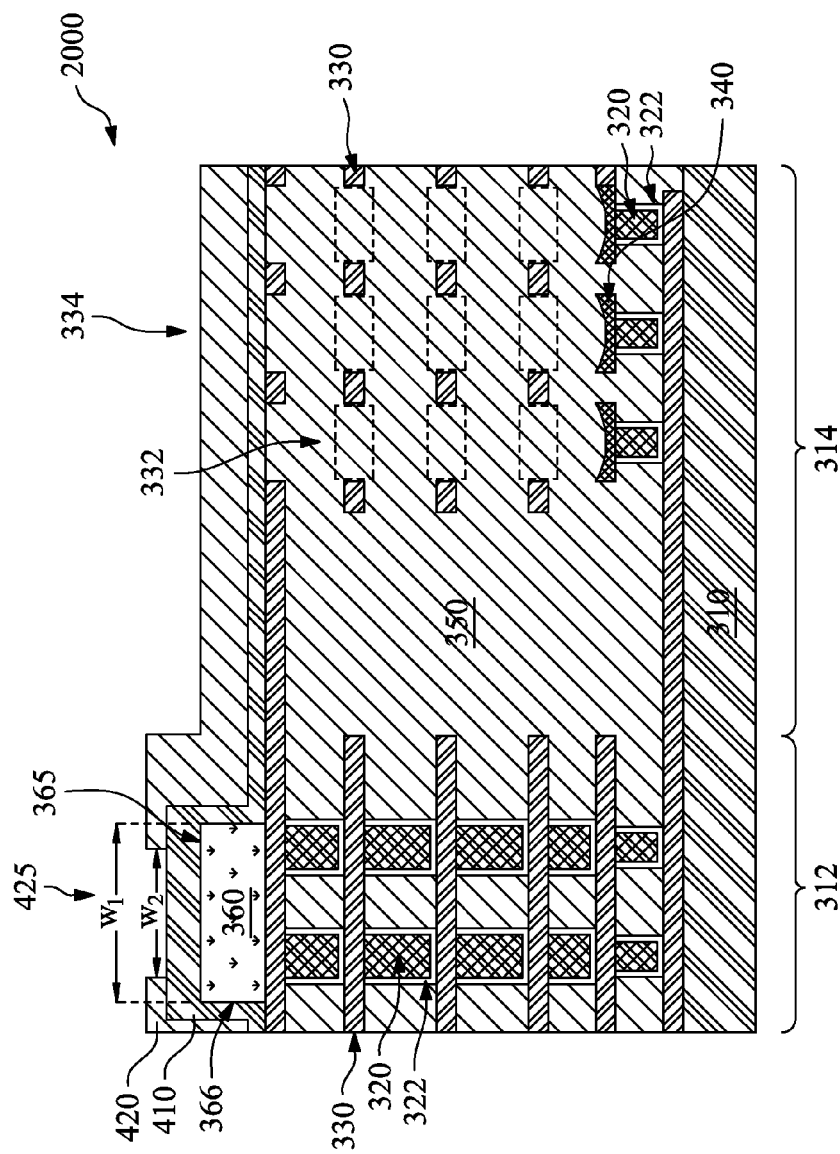

Referring to FIGS. 2 and 5, the method 200 proceeds to step 208 by forming an opening 425 in the passivation layer 420. The opening 425 is aligned to the bonding pad 360 and has a second width $w_2$, which is smaller than a first width $w_1$ of the bonding pad 360. In the present embodiment, a portion of the ESL 410 is exposed in the opening 425. In one embodiment, the opening 425 is formed by forming a patterned photoresist layer over the passivation layer 420 by lithography process and then etching the passivation layer 420 through the patterned photoresist layer. As has been mentioned above, the passivation layer 420 is etched by a selective etch process, which but not substantially etch the ESL 410 to ensure an adequate thickness of the ESL 410 remain as an etching stopper for a subsequent etching process. The etching process may include a selective wet etch, a selective dry etch, or a combination thereof.

Figure 6:
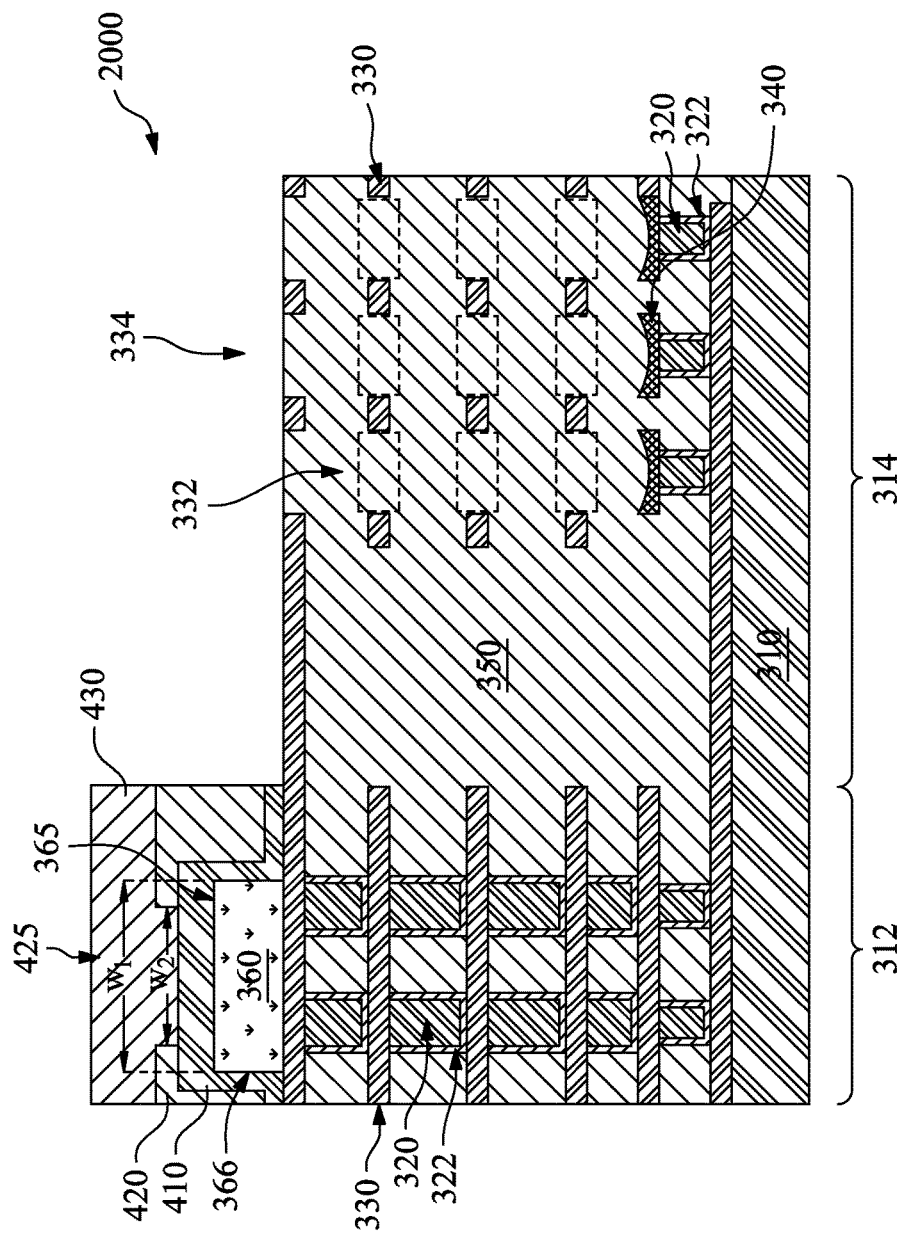

Referring to FIGS. 2 and 6, the method 200 proceeds to step 210 by removing the passivation layer 420 and the ESL 410 in the pixel region 314 while protecting the circuit region 312 with a first patterned hard mask (HM) 430. In one embodiment, the first patterned HM 430 is a first patterned photoresist layer and patterned by a lithography process. In another embodiment, the first patterned HM 430 is formed by deposition, patterning and etching processes. The passivation layer 420 and the ESL 410 in the pixel region 314 are removed by a suitable etch technique, such as a wet etch, a dry etch, and/or a combination thereof. The first patterned HM 430 is then removed by a process such as wet stripping or $O_2$ plasma.

Figure 7A:
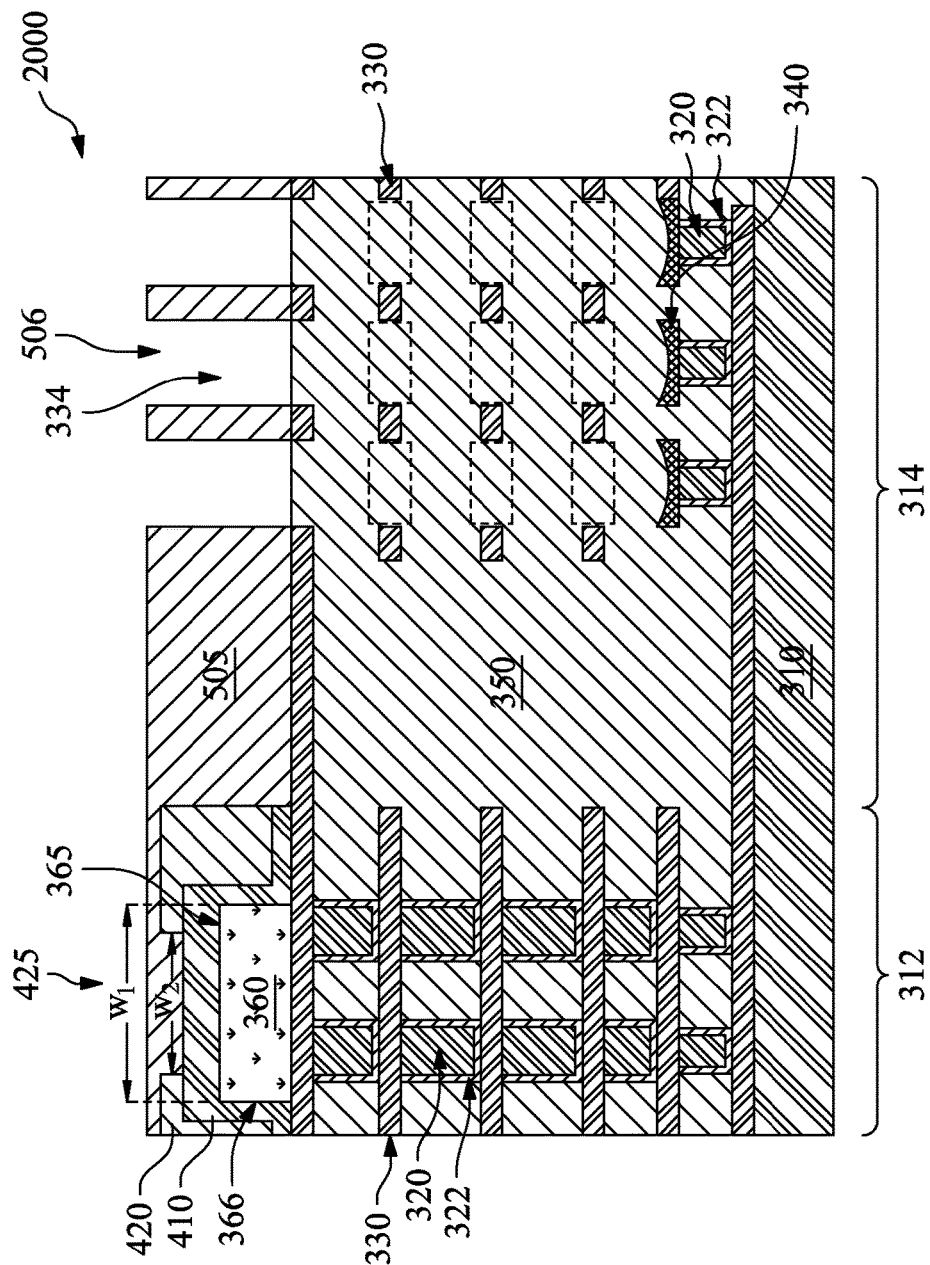
Figure 7B:
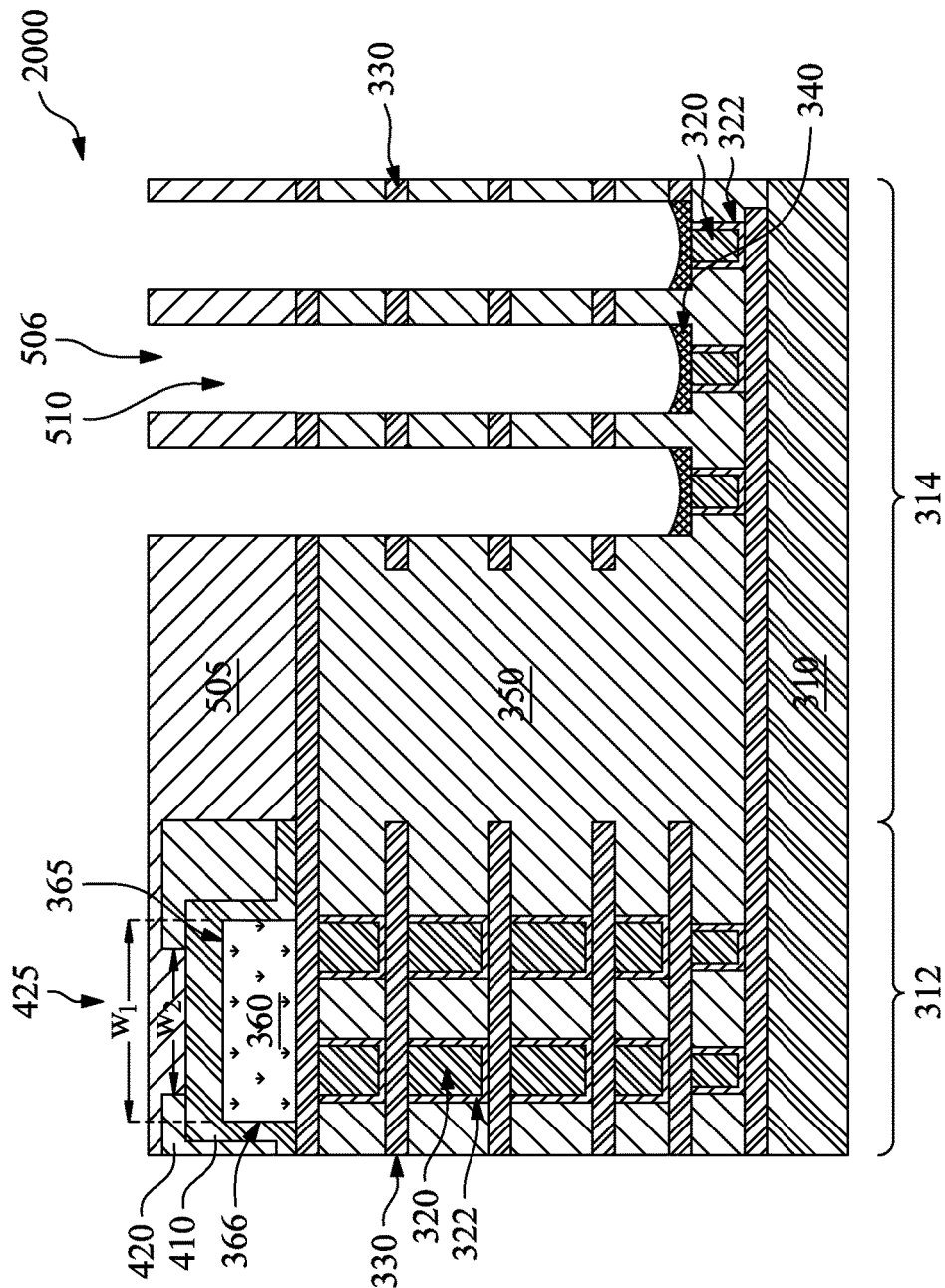

Referring to FIGS. 2 and 7A-7B, the method 200 proceeds to step 212 by forming a plurality of pixel wells (or referred to as pixel) 510 in the pixel region 314. In one embodiment, a second patterned HM 505 is formed over the circuit region 312 and the pixel region 314. The second patterned HM 505 has a plurality of openings 506 in the pixel region 314. The opening 506 is aligned to the respective aperture region 334, as shown in FIG. 7A. In one embodiment, the second patterned HM 505 is a second patterned photoresist layer and patterned by a lithography process. In another embodiment, the second patterned HM 505 is formed by deposition, patterning and etching processes.

The insulating layer 350 is then etched through the opening 506 to form the pixel well 510, as shown in FIG. 7B. The insulating layer 350 may be etched by various methods, including a dry etch, a wet etch, or a combination thereof. For an example, a dry etching process may include fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), other suitable gases and/or plasmas, and/or combinations thereof. The etching process may include a multiple-step etching to gain etch selectivity, flexibility and a desired etch profile. In some embodiments, the base electrode 340 is exposed in the respective pixel well 510. The second patterned HM 505 is then removed by a process such as wet stripping or $O_2$ plasma.

Figure 8:
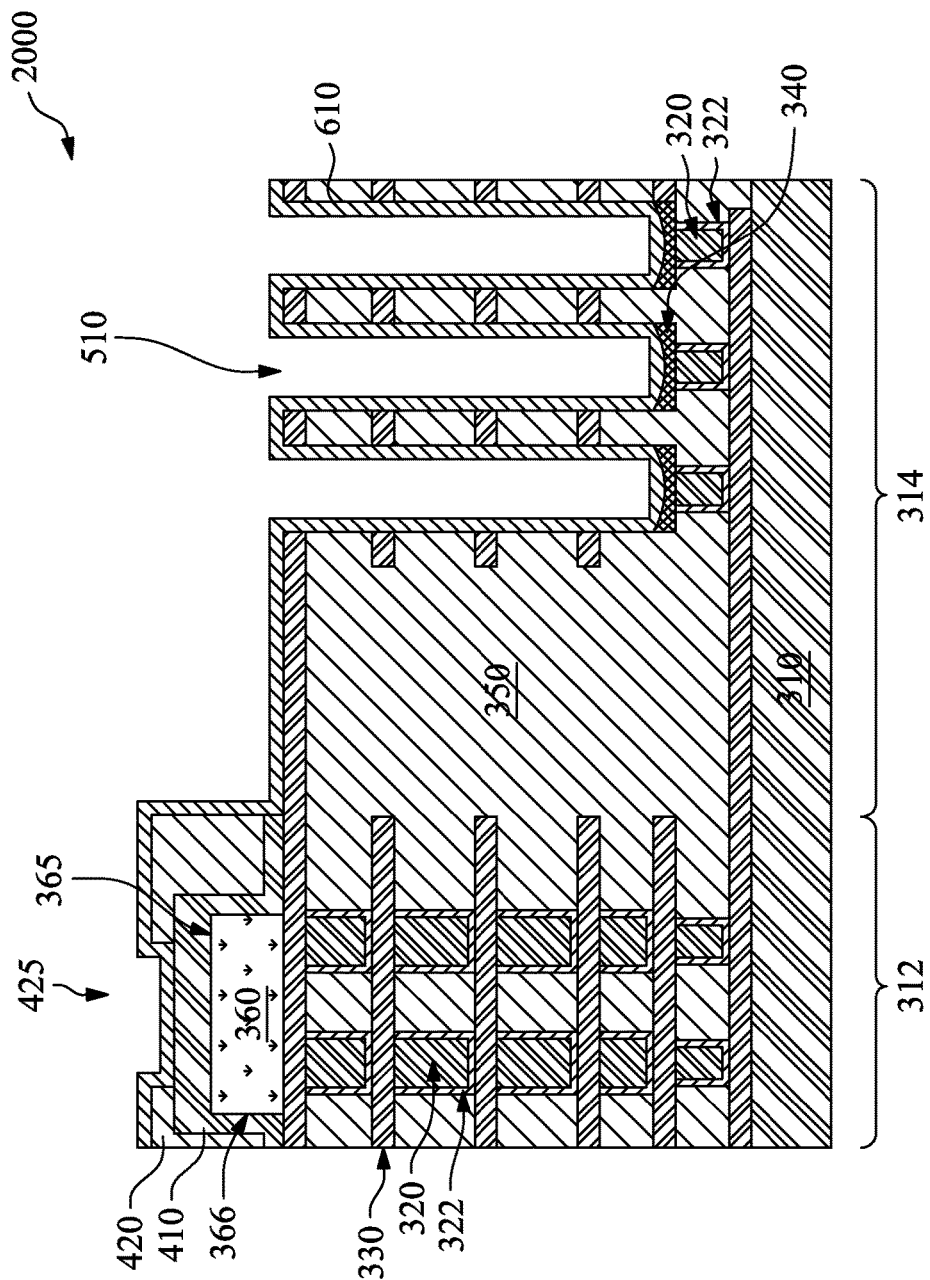

Referring to FIGS. 2 and 8, the method 200 proceeds to step 214 by depositing an anti-charging layer 610 in the pixel region 314, including along sidewalls of the pixel well 510. The anti-charging layer 610 along sidewalls of the pixel well 510 provides an efficient dissipation path for accumulated charges on the insulating layer 350. The accumulated charges on the insulating layer 350 may deflect incoming electrons and cause pattern distortion. The anti-charging layer 610 is deposited over the circuit region 312 as well, including depositing over the exposed ESL 410 within the opening 425. In the present embodiment, the anti-charging layer 610 includes a material which is different from the ESL 410 to achieve etching selectivity in subsequent etches. The anti-charging layer 610 may include metal oxide, such as aluminum oxide, tantalum oxide, zinc oxide, zirconium oxide, or any suitable materials. In some embodiments, the anti-charging layer 610 may include homogeneous binary metal oxide, such as $ZnO/ZrO_2$, $ZnO/Al_2O_3$, or other suitable materials. In some embodiments, the anti-charging layer 610 may include the multi-layer structure of metal, metal oxide, metal nitride, or the combination, such as $Mo/Al_2O_3$, $Mo/ZrO_2$, $W/Al_2O_3$, $W/ZrO_2$, or any suitable materials. In the present embodiment, the anti-charging layer 610 is conformably deposited along sidewalls of the pixel wells 510 by a suitable technique, such as ALD, or CVD.

Figure 9:
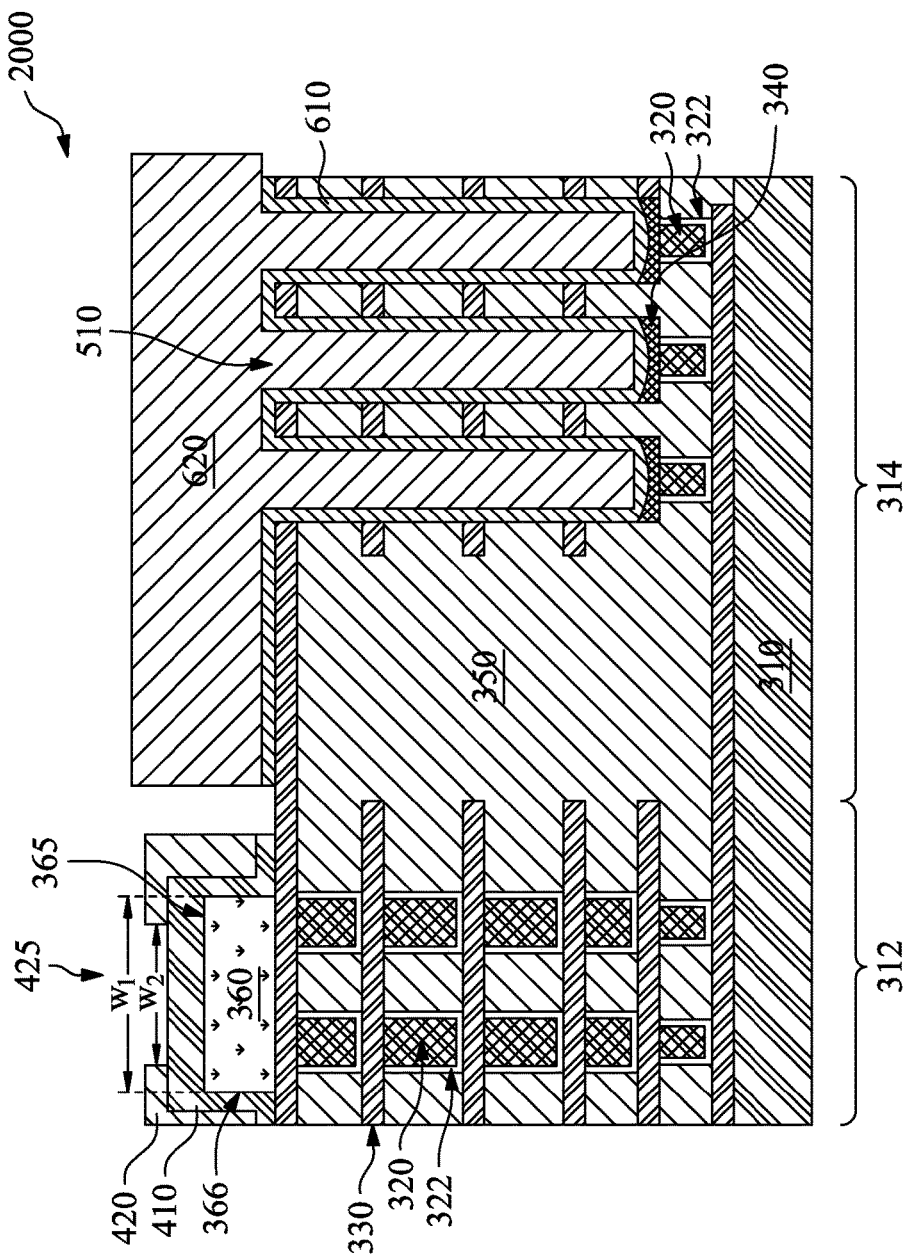

Referring to FIGS. 2 and 9, the method 200 proceeds to step 216 by removing the anti-charging layer 610 in the circuit region 312, including in the opening 425 with the ESL 410 as an etch stop layer. In the meantime, the pixel region 314 is protected by a third patterned HM 620. In one embodiment, the third patterned HM 620 is a third patterned photoresist layer and formed by lithography process known in the art. In another embodiment, the third patterned HM 620 is formed by deposition, patterning and etching processes. After forming the third pattern HM 620 to cover the pixel region 314, an etching process is performed to remove the anti-charging layer 610 in the circuit region 312, including in the opening 425. The etching process may include a wet etch, a dry etch, or/and a combination thereof. As has been mentioned above, the ESL 410 serves as an etching stop layer to avoid adverse impact on the bonding pad 360 during removing the anti-charging layer 610, such as excessive surface roughness caused by surface damage. Also by using the ESL 410, etching process constrains in removing the anti-charging layer 610, such as etch selectivity and over etch control, is relaxed. After removing the anti-charging layer 610, the ESL 410 is exposed in the opening 425.

Figure 10:
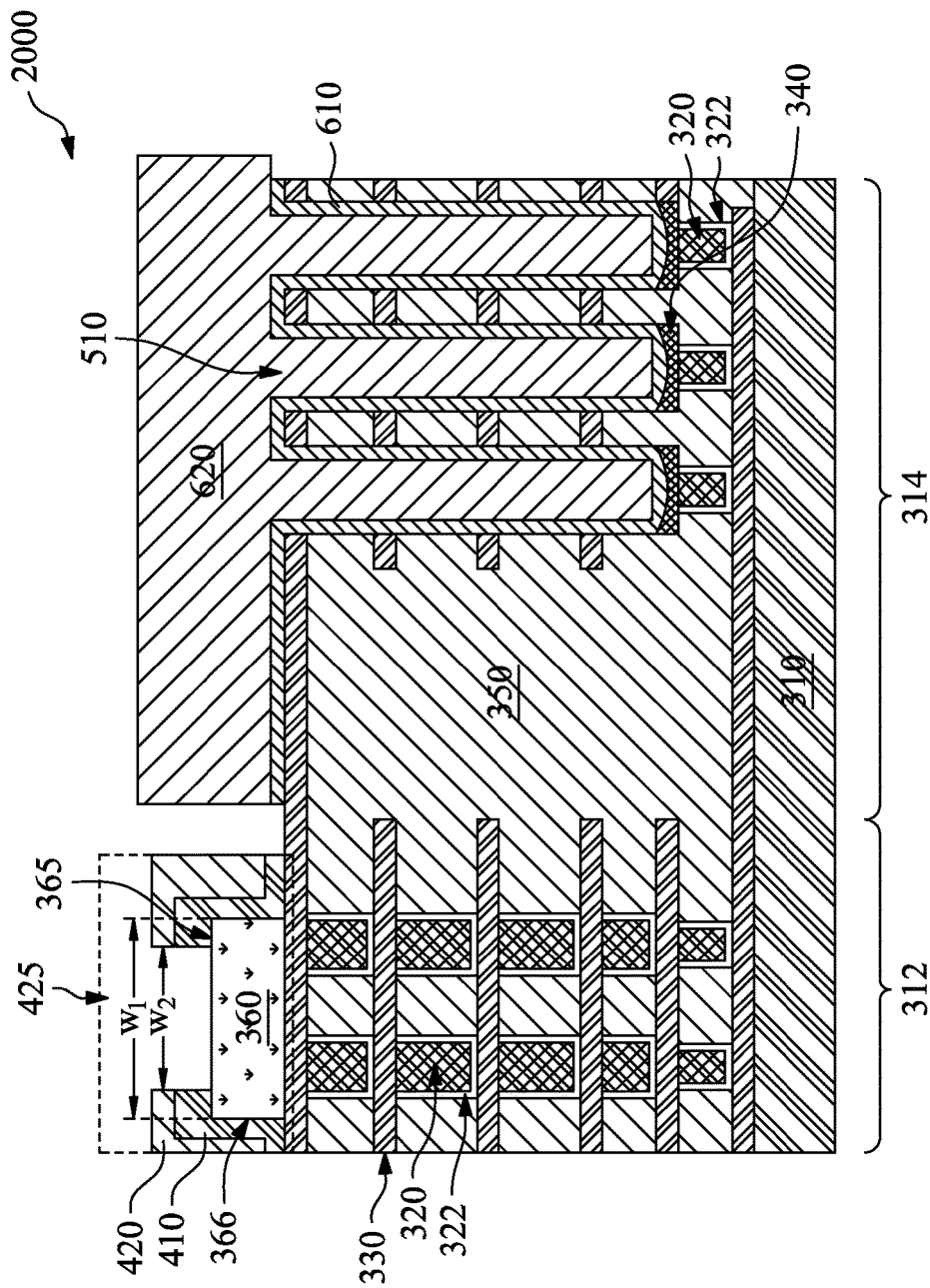

Referring to FIGS. 2 and 10, the method 200 proceeds to step 218 by removing the exposed ESL 410 in the opening 425 to expose a portion of the top surface 365 of the bonding pad 360, while the pixel region 314 is still protected by the third patterned HM 620. As has been mentioned before, the etch process is properly chosen to selectively remove the ESL 410, but does not substantially etch the bonding pad 360 and the passivation layer 420. Therefore, the ESL 410 underneath the passivation layer 420 remains intact. The selective etch may include a selective wet etch, a selective dry etch, and/or a combination thereof.

Referring again to the FIG. 10, in the circuit region 312, the exposed portion of the top surface 365 of the bonding pad 360 in the opening 425 retains its uniform surface topography, which is important for a future bonding process. As shown, edges of the top surface 365 (which is the top surface 365 between the first width $w_1$ and the second width $w_2$) and sidewalls 366 of the bonding pad 360 is sealed by the ESL 410 and the passivation layer 420 to protect them from contaminations, moistures and scratches. In the meantime, the pixel region 314 is protected by the third patterned HM 620, including pixel wells 510.

It is understood that additional steps can be provided before, during, and after the method 200, and some of the steps described can be replaced or eliminated for other embodiments of the method 200.

For example, the DPG device 2000 may be bonded with a second device, such as a electric device or a mechanical device, together through the bonding pad 360 and a plurality of bonding pads formed in the second device. Furthermore, the bonding pads located at the second device are aligned face-to-face with their corresponding bonding pads 360 at the DPG device 2000. In some embodiment, the third patterned HM 620 protects the pixel region 314 during the bonding process. In accordance with some embodiments, in a direct bonding process, the connection between the DPG device 2000 and the second device can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof.

Based on the above, the present disclosure offers a method of fabricating a DPG device. The method provides an integration of forming an anti-charging layer over sidewalls of a pixel well while protecting a top surface of bonding pads. The method employs forming an ESL to protect a top surface of the bonding pad during removal of the anti-charging layer. This is especially advantageous when the etch process of removing the anti-charging layer experiences an inadequate selectivity with respect to the bonding pad. The method demonstrates reducing/or eliminating surface damage of the bonding pad and reducing failure rate of a future ponding process.

The present disclosure provides many different embodiments of fabricating a DPG device that provide one or more improvements over existing approaches. In one embodiment, a method for fabricating a DPG device includes providing a substrate having a circuit region and a pixel region. The circuit region includes a bonding pad disposed over an interconnect structure and the pixel region includes an insulating layer having a base electrode embedded in the insulating layer. The method also includes forming an etch-stop-layer (ESL) over the bonding pad in the first region such that the bonding pad is covered by the ESL, forming a pixel well in the second region that extends through the insulating layer to expose the base electrode, forming an anti-charging layer over the bonding pad and along sidewalls of the pixel well. The bonding pad is covered by the ESL during the forming of the anti-charging layer over the bonding pad. The method also includes removing the anti-charging layer over the bonding pad. Therefore, after removing the anti-charging layer over the bonding pad, the bonding pad remains covered by the ESL.

In yet another embodiment, a method includes providing a substrate having a bonding pad in a first region, forming an etch-stop-layer (ESL) in the first region, including wrapping over a top surface and sidewalls of the bonding pad. The method also includes forming a passivation layer over the ESL, having an opening to expose a portion of the ESL over the top surface of the bonding pad. The method also includes forming a pixel well in a second region of the substrate, depositing an anti-charging layer over the substrate, including along sidewalls of the pixel well. The method also includes removing the anti-charging layer in the first region with the ESL to protect the top surface of the bonding pad.

In yet another embodiment, a device includes a substrate having a first region and a second region, a pixel well in the first region, an anti-charging layer disposed in the first region, including along sidewalls of the pixel well. The device also includes a bonding pad in the second region, an etch-stop-layer (ESL) along sidewalls of the bonding pad, including extending to wrap over edges of a top surface of the bonding pad. The device also includes a passivation layer over the ESL. Thus a portion of a top surface of the bonding pad is not covered by the passivation layer and the ESL. The portion of the top surface of the bonding pad has an uniform surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate having a circuit region and a pixel region, wherein the circuit region includes a bonding pad disposed over an interconnect structure and the pixel region includes an insulating layer having a base electrode embedded in the insulating layer;
   forming an etch-stop-layer (ESL) over the bonding pad in a first region such that the bonding pad is covered by the ESL;
   forming a pixel well in a second region that extends through the insulating layer to expose the base electrode;
   forming an anti-charging layer over the bonding pad and along sidewalls of the pixel well, wherein the bonding pad is covered by the ESL during the forming of the anti-charging layer over the bonding pad; and
   removing the anti-charging layer over the bonding pad, wherein after removing the anti-charging layer over the bonding pad, the bonding pad remains covered by the ESL.

2. The method of claim 1, wherein forming the ESL over the bonding pad in the first region includes:
   depositing the ESL over the substrate; and
   removing the ESL from the second region while protecting the first region by a first hard mask.

3. The method of claim 2, further comprising:
   prior to removing the ESL in the second region, forming a passivation layer in the first region, having an opening to expose a portion of the ESL which is over a top surface of the bonding pad.

4. The method of claim 3, wherein forming the passivation layer in the first region includes:
   depositing the passivation layer over the ESL in the first region and the second region;
   forming the opening in the passivation layer to expose the portion of the ESL within the opening, wherein the opening aligns to the bonding pad; and
   removing the passivation layer in the second region while protecting the first region by a second hard mask.

5. The method of claim 4, wherein forming the opening in the passivation layer includes:
   forming a patterned photoresist layer over the passivation layer; and
   etching the passivation layer through the patterned photoresist layer.

6. The method of claim 4, wherein the anti-charging layer is deposited over the exposed ESL within the opening and over the passivation layer outside the opening.

7. The method of claim 1, further comprising:
   after removing the anti-charging layer in the first region, removing the ESL to expose a top surface of the bonding pad.

8. The method of claim 7, wherein the ESL is removed by a selective etch, which has selectivity with respect to the bonding pad.

9. The method of claim 7, further comprising:
   protecting the second region with a third hard mask during removing the ESL.

10. A method comprising:
    providing a substrate having a bonding pad in a first region;
    forming an etch-stop-layer (ESL) in the first region, including wrapping over a top surface and sidewalls of the bonding pad;
    forming a passivation layer over the ESL, having an opening to expose a portion of the ESL over the top surface of the bonding pad;
    forming a pixel well in a second region of the substrate;
    depositing an anti-charging layer over the substrate, including along sidewalls of the pixel well; and
    removing the anti-charging layer in the first region with the ESL to protect the top surface of the bonding pad.

11. The method of claim 10, wherein forming the ESL in the first region includes:
    depositing the ESL over the substrate; and
    removing the ESL from the second region while protecting the first region by a first hard mask.

12. The method of claim 10, wherein forming the passivation layer over the ESL includes:
    depositing the passivation layer over the ESL in the first region and the second region;
    forming the opening in the passivation layer to expose the ESL within the opening, wherein the opening aligns to the bonding pad; and
    removing the passivation layer in the second region while protecting the first region by a second hard mask.

13. The method of claim 12, wherein forming the passivation layer over the ESL, having the opening to expose the portion of the ESL over the top surface of the bonding pad includes:
    forming a patterned photoresist layer over the passivation layer; and
    etching the passivation layer through the patterned photoresist layer to form the opening.

14. The method of claim 10, wherein the anti-charging layer is deposited over the exposed ESL within the opening and over the passivation layer outside the opening.

15. The method of claim 10, further comprising:
    after removing the anti-charging layer in the first region, removing the ESL to expose the top surface of the bonding pad within the opening.

16. The method of claim 15, wherein the ESL is removed by a selective etch, which has selectivity with respect to the bonding pad.

17. The method of claim 15, further comprising:
    protecting the second region with a third hard mask during removing the ESL within the opening.

18. A method comprising:
    forming an etch-stop-layer (ESL) over a bonding pad disposed over an insulating layer;
    forming a trench in the insulating layer;
    forming an anti-charging layer over the ESL and within the trench; and
    removing a portion of the anti-charging layer to expose the ESL disposed over the bonding pad, wherein after removing the anti-charging layer over the bonding pad, the bonding pad remains covered by the ESL.

19. The method of claim 18, further comprising:
    forming a patterned hard mask layer over the ESL and over the anti-charging layer disposed within the trench; and
    removing a portion of the ESL to expose the bonding pad while using the patterned hard mask layer as a mask.

20. The method of claim 19, wherein the anti-charging layer disposed within the trench defines a recess, and wherein the patterned hard mask layer is disposed within the recess.

* * * * *